(12) United States Patent
Reichl et al.

(10) Patent No.: US 10,720,891 B2
(45) Date of Patent: *Jul. 21, 2020

(54) STABILIZATION OF DIRECT LEARNING ALGORITHM FOR WIDEBAND SIGNALS

(71) Applicant: Nokia Solutions and Networks GmbH and Co. KG

(72) Inventors: Christian Reichl, Hirschau (DE); Shavantha Kularatna, Flower Mound, TX (US); Rene Roeschke, Mammendorf (DE); Bjoern Jelonnek, Ulm (DE)

(73) Assignee: Nokia Solutions And Networks GMBH And Co. KG, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/239,706

(22) Filed: Jan. 4, 2019

(65) Prior Publication Data
US 2019/0149103 A1 May 16, 2019

Related U.S. Application Data

(63) Continuation of application No. 15/549,750, filed as application No. PCT/EP2015/052684 on Feb. 10, 2015, now Pat. No. 10,199,993.

(51) Int. Cl.
H03F 1/26 (2006.01)
H03F 1/32 (2006.01)
(Continued)

(52) U.S. Cl.
CPC ......... *H03F 1/3247* (2013.01); *H03F 1/3258* (2013.01); *H03F 3/189* (2013.01);
(Continued)

(58) Field of Classification Search
CPC ..................... H03F 1/3241; H03F 1/3247
(Continued)

(56) References Cited

U.S. PATENT DOCUMENTS 10,199,993 B2 * 2/2019 Reichl .................. H03F 1/3247
2017/0244582 A1 8/2017 Gal

FOREIGN PATENT DOCUMENTS

WO WO 2012/092647 A1 7/2012

OTHER PUBLICATIONS

Boudinov, Edouard R., et al., "An efficient conjugate direction method with orthogonalization for large-scale quadratic optimization problems", Optimization Methods and Software, vol. 22, No. 2, Apr. 1, 2007, 26 pgs.
(Continued)

Primary Examiner — Steven J Mottola
(74) Attorney, Agent, or Firm — Harrington & Smith

(57) ABSTRACT

The present invention addresses method, apparatus and computer program product for stabilization of the direct learning algorithm for wideband signals. Thereby, a signal to be amplified is input to a pre-distorter provided for compensating for non-linearity of the power amplifier, and the pre-distorted output signal from the pre-distorter is forwarded to the power amplifier. Parameters of the pre-distorter are adapted based on an error between the linearized signal output from the power amplifier and the signal to be amplified using an adaptive direct learning algorithm, and the linear system of equations formed by the direct learning algorithm are solved using a conjugate gradient algorithm, wherein, once per direct learning algorithm adaptation, at least one of the initial residual and the initial direction of the conjugate gradient algorithm are set based on the result of the previous adaptation.

14 Claims, 3 Drawing Sheets

(51) Int. Cl.
  *H03F 3/195* (2006.01)
  *H03F 3/24* (2006.01)
  *H04L 27/36* (2006.01)
  *H04L 1/18* (2006.01)
  *H03F 3/189* (2006.01)

(52) U.S. Cl.
  CPC ............... *H03F 3/195* (2013.01); *H03F 3/24* (2013.01); *H04L 1/1887* (2013.01); *H04L 27/368* (2013.01); *H03F 2201/3212* (2013.01); *H03F 2201/3233* (2013.01)

(58) Field of Classification Search
  USPC ........................................ 330/149; 455/114.3
  See application file for complete search history.

(56) References Cited

OTHER PUBLICATIONS

Kecman, Vojislav, et al., "Algorithms for Direct L2 Support Vector Machines", © 2014 IEEE, 6 pgs.

Mkadem, Farouk, et al., "Physically Inspired Neural Network Model for RF Power Amplifier Behavioral Modeling and Digital Predistortion", © 2011 IEEE, 11 pgs.

Zayani, Rafik, et al., "Levenberg-Marquardt Learning Neural Network for Adaptive Predistortion for Time-Varying HPA with Memory in OFDM Systems", $16^{th}$ European Signal Processing Conference (EUSIPCO 2008), Lausanne, Switzerland, Aug. 25-29, 2008, © by EURASIP, 5 pgs.

\* cited by examiner

STABILIZATION OF DIRECT LEARNING ALGORITHM FOR WIDEBAND SIGNALS

CROSS REFERENCE TO RELATED APPLICATIONS

This application is a continuation of U.S. patent Ser. No. 15/549,750, filed on Aug. 9, 2017, which claims priority to and is a national stage application under 35 U.S.C. § 371 of PCT/EP2015/052684, filed on Feb. 10, 2015, the disclosures of which are hereby incorporated by reference in their entirety.

FIELD OF THE INVENTION

The present invention generally relates to wireless mobile communication system, and more specifically relates to an apparatus and method for stabilization of the direct learning algorithm for wideband signals.

BACKGROUND

In wireless mobile communication a wideband mobile communication system using complex modulation techniques is known, wherein such technologies often require linear power amplifiers PA for its radio frequency RF transmissions. However, in general, low power consumption is aspired for mobile systems. Therefore, a power amplifier may be operated at compressed regions.

In general, a power amplifier and an associated low power analog transmitter in radio devices behave non-linearly when operated at compressed regions. Since non-linearity may cause severe problems in regard of control of the system, it is expedient to eliminate or at least abate the non-linearity thereof. One possible approach that solves the non-linearity issue is to conduct a considerable back off, so that the operation region becomes linear. However, this is very inefficient and does not yield desired power savings.

Further, digital baseband pre-distortion has been recognized as a cost effective technique for linearizing power amplifiers PA. According to this technique, the PA input signal is distorted by a pre-distortion means whose characteristics are basically the inverse of those of the amplifier. That is, a Digital Pre-Distortion DPD algorithm applying orthogonal polynomials used for control in radio devices that allows the RF signal to operate in the compression region is known. Operating in compressive regions enables power savings due to increased efficiency. However, operating in such regions will also increase the inter modulation IM products. However, Increase of IM products in general violates the 3GPP specifications.

Thus, the primary role of the DPD algorithm is to reduce the IM products, so that the radio device can operate efficiently in compliance with the 3GPP specifications.

In general, there are two broad categories of DPD algorithms:
 a) DPD algorithms that compute the correct PA model or the inversion model in a single try;
 b) DPD algorithms that compute the correct PA model or the inversion model adaptively using many tries.

Both categories yield the correct answer. Category a) can be used to implement a 'Direct-' as well as an 'Indirect Learning Algorithm'. In a direct learning algorithm DLA, the non-linearity is modeled from input to output, i.e. model equations from input variables describe the output. In an Indirect Learning Algorithm ILA, the non-linearity is modeled from the output to input, i.e. equations that consist of the output signal describe the input. Typically, in an ILA method, the inverse non-linear model is computed in a single try. Hence, no extra effort is required to compute the inverse model.

With the direct learning algorithm the non-linear model is obtained rather than the inverse model. Hence, an iterative process is normally pursued to obtain the inverse. With category a) algorithms, this inversion process is fixed to a pre-determined value (i.e. 2, 3, ..., 5 etc). Examples are the fixed point algorithms with N1 iterations or Newton Method with N2 iterations. N1 and N2 are selected based on the required convergence accuracy of the inverse model. Another factor that limits N1 and N2 are hardware limitations.

On the other hand, DLA or ILA algorithms can be implemented adaptively as well. Due to its simplicity, the adaptive implementation of ILA is rarely pursued. However, it is very common to have DLA implemented in an adaptive manner via a known inversion algorithm listed above.

Adaptive implementation of fixed point method or Newton method can be particularly advantageous if newer updates are always better than the previous update. In this case, N1 and N2 can be infinite (practically very large). Since DLA accuracy improves with larger N1 and N2, the best correction results for a DPD system may be achieved.

In general, DLA algorithms that are adaptively implemented specify an error bound. Hence, if this error bound is achieved after N3 adaptations (i.e. error is lower than the bound), the inverse model is assumed to be accurate. The algorithm will stop at N3. If for some reason the static conditions cannot be maintained due to slow perturbation of the non-linear system, the adaptive algorithm needs to be re-started from the initial conditions. This is normally called the restart of the algorithm.

However, the above 'adapt and stop mechanism' is only suited for static conditions where the non-linear system doesn't change frequently. In a wireless environment where dynamic data traffic models exist, the power amplifier tends to change continuously. Further, dynamic traffic conditions cause the power amplifier temperature to change. In addition, the dynamic traffic can change the gain of the power amplifier as well. Another factor that changes the power amplifiers is aging due to lifetime.

While a periodic restart of the algorithm would solve the dynamic traffic cases, the time to achieve the error bound is an important factor in commercial radios. Until the final error bound is achieved, it is safe to assume that inter-modulation (IM) products will not achieve the 3GPP specifications.

Hence, in a wireless environment, the continuous adaptation may preferably take place in anticipation of PA change. However, the continuous adaptation can bring instability due to numerical error accumulation (e.g. floating point errors). This is because when adaptations tend to be very large, even a small numerical error per step can cause a huge accumulation of noise.

In some instances (more likely with narrow band signals) instability occurs after 1000 s of adaptations. However, with wideband signals, this instability can occur in less than 100 adaptations. If this instability is not checked, the adaptive DLA algorithm will diverge causing inter modulation products to rise with time.

SUMMARY OF THE INVENTION

In order to overcome the drawbacks of the prior art, it is an object underlying the present invention to provide an improved wireless mobile communication system, and more specifically to provide an improved apparatus, method and computer program product for stabilization of the direct learning algorithm for wideband signals.

According to a first aspect of the present invention, there is provided a method for controlling a power amplifier operating in a non-linear state, comprising inputting a signal to be amplified to a pre-distorter provided for compensating for non-linearity of the power amplifier, forwarding the pre-distorted output signal from the pre-distorter to the power amplifier, adapting parameters of the pre-distorter based on an error between the linearized signal output from the power amplifier and the signal to be amplified using an adaptive direct learning algorithm, and solving the linear system of equations formed by the direct learning algorithm using a conjugate gradient algorithm, wherein, once per direct learning algorithm adaptation, at least one of the initial residual and the initial direction of the conjugate gradient algorithm are set based on the result of the previous adaptation.

According to a second aspect of the present invention, there is provided An apparatus for controlling a power amplifier, comprising a pre-distorter, at least one processor, and at least one memory for storing instructions to be executed by the processor, wherein the at least one memory and the instructions are configured to, with the at least one processor, cause the apparatus at least to perform inputting a signal to be amplified to a pre-distorter provided for compensating for non-linearity of the power amplifier; forwarding the pre-distorted output signal from the pre-distorter to the power amplifier, adapting parameters of the pre-distorter based on an error between the linearized signal output from the power amplifier and the signal to be amplified using an adaptive direct learning algorithm, and solving the linear system of equations formed by the direct learning algorithm using a conjugate gradient algorithm, wherein, once per direct learning algorithm adaptation, at least one of the initial residual and the initial direction of the conjugate gradient algorithm are set based on the result of the previous adaptation.

According to a third aspect of the present invention, there is provided a computer program product comprising computer-executable components which, when the program is run, are configured to carry out the method according to the first aspect.

Advantageous further developments or modifications of the aforementioned exemplary aspects of the present invention are set out in the dependent claims.

According to certain embodiments of the invention, the initial residual and/or the initial direction of the conjugate gradient algorithm is/are set at the beginning of the adaptation.

According to certain embodiments of the invention, the initial residual and/or the initial direction of the conjugate gradient algorithm is/are set so as to fulfill the following equations:

$$r_{init} = b - A^* x_{n-1}$$

$$d_{init} = r_{init}$$

wherein $r_{init}$ is the initial residual vector, $d_{init}$ is the initial direction vector, b is the cross-correlated vector of the error, A is the autocorrelation matrix, and $x_{n-1}$ is the solution vector at the $(n-1)^{th}$ direct learning algorithm adaptation.

According to certain embodiments of the invention, loops of the conjugant gradient algorithm are iterated until reaching a preset number of loops. Thereby, the preset number of loops is far less than what is required by the standard conjugate gradient algorithm (i.e. 4-32 loops vs. 1000 s for adaptation).

According to certain embodiments of the invention, the initial residual and/or the initial direction of the conjugate gradient algorithm is/are computed based on the partially converged solution of the previous adaptation.

According to certain embodiments of the invention, an error scaling factor is introduced In the adaptive direct learning algorithm, so as to fulfill the following equation:

$$y(n) = x(n) - \mu^* e(n)$$

wherein y is the pre-distorted signal vector, x is a vector of the signal to be amplified, e is the error vector, μ is the error scaling factor, and indicates the adaptation number. Thereby, the error scaling factor may be set to a value smaller than 1.0, preferably to μ=(0.1, 0.2, 0.25, 0.5, . . . ).

BRIEF DESCRIPTION OF DRAWINGS

For a more complete understanding of example embodiments of the present invention, reference is now made to the following descriptions taken In connection with the accompanying drawings In which.

DESCRIPTION OF EXEMPLARY EMBODIMENTS

Exemplary aspects of the present invention will be described herein below. More specifically, exemplary aspects of the present invention are described hereinafter with reference to particular non-limiting examples and to what are presently considered to be conceivable embodiments of the present invention. A person skilled in the art will appreciate that the invention is by no means limited to these examples, and may be more broadly applied.

It is to be noted that the following description of the present invention and its embodiments mainly refers to specifications being used as non-limiting examples for certain exemplary network configurations and deployments. Namely, the present invention and its embodiments are mainly described in relation to 3GPP specifications being used as non-limiting examples for certain exemplary network configurations and deployments. As such, the description of exemplary embodiments given herein specifically refers to terminology which is directly related thereto. Such terminology is only used in the context of the presented non-limiting examples, and does naturally not limit the invention in any way. Rather, any other network configuration or system deployment, etc. may also be utilized as long as compliant with the features described herein.

Hereinafter, various embodiments and implementations of the present invention and its aspects or embodiments are described using several alternatives. It is generally noted that, according to certain needs and constraints, all of the described alternatives may be provided alone or in any conceivable combination (also including combinations of individual features of the various alternatives).

In particular, the following examples, versions and embodiments are to be understood only as illustrative examples. Although the specification may refer to "an", "one", or "some" example version(s) or example embodiment(s) in several locations, this does not necessarily mean that each such reference is to the same example version(s) or example embodiment(s), or that the feature only applies to a single example version or example embodiment. Single features of different example embodiments may also be combined to provide other example embodiments. Furthermore, words "comprising" and "including" should be understood as not limiting the described example embodiments to consist of only those features that have been mentioned and such example versions and example embodiments may also contain also features, structures, units, modules etc. that have not been specifically mentioned.

Figure 1:
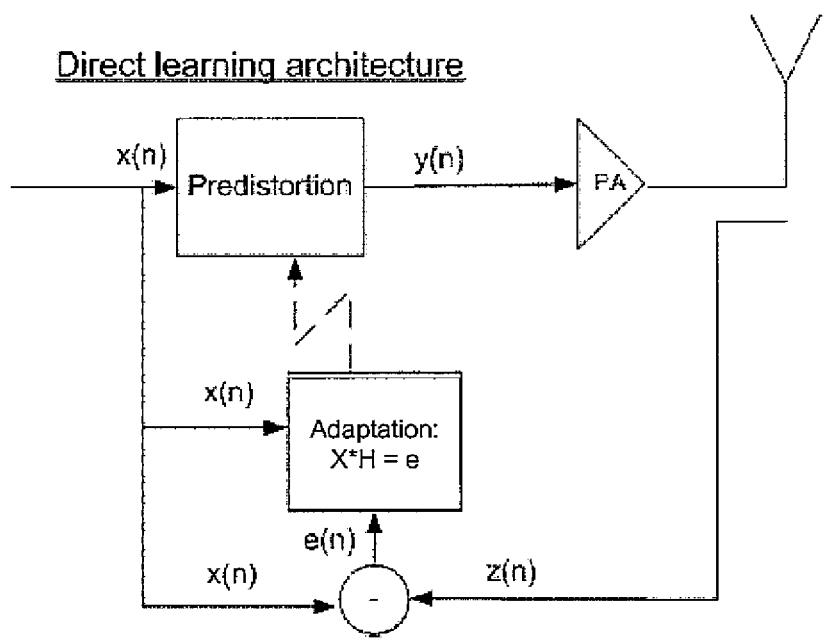
FIG. 1 schematically illustrates a direct learning architecture for performing an adaptive direct learning algorithm according to certain embodiments of the present invention.

FIG. 1 schematically illustrates a direct learning architecture for performing an adaptive direct learning algorithm according to certain embodiments of the present invention. In particular, supported equations of the adaptive DLA are shown therein. Nevertheless, it is to be noted that the formulas supporting FIG. 1 may diverge when the accumulated floating point error is significant compared to the inter-modulation (IM) corrections.

As is depicted in FIG. 1, the signal x(n) indicates an un-pre-distorted signal which is input in a pre-distortion means. An output of the pre-distortion means is labeled with y(n), which indicates a pre-distorted signal.

The signal indicated as z(n) is a linearized signal. In the best case this signal should be as close as possible to x(n). For simplicity gain and phase of the PA are normalized to unity gain and zero phase.

The signal e(n) indicates an error between z(n) and x(n). The idea according to certain embodiments of the present invention is to minimize this error.

An adaptation X*H=e is performed based on the pre-distorted signal x(n) and the error e(n), and the pre-distortion is adapted according to the adaptation, so as to achieve an accurate signal y(n) which is to be input in the power amplifier PA.

In the following, equations supporting the traditional DLA are shown:

In order to obtain the error e(n) in adaptive step n, the following equation (1) applies:

$$e(n)=z(n)-x(n) \qquad (1)$$

According to the direct learning algorithm DLA in the 'A*H=b' form (system of linear equations), A is the auto-correlation matrix ($X^H X$), and b is the cross correlated vector $X^H e(n)$. L1 in the following equations (2) depicts the order of non-linearity. Thereby, x' is not a vector function.

$$X=[x'(n)x'(n-1)x'(n-T) \ldots x'(n)|x(n)|^{L1}x'(n-1)|x'(n-1)|^{L1}x'(n-T)|x'(n-T)|x'(n-T)|^{L1}$$

$$x'(N+n)x'(N+n-1)x'(N+n-T) \ldots x'(N+n)|x'(N+n)|^{L1}x'(N+n-1)|x'(N+n-1)|^{L1}x'(N+n-T)|x'(N+n-T)|^{L1}]$$

$$H=[h'(n)h'(n-1) \ldots h'(n-T)]^T$$

$$(X^H X)*H=X^H E$$

$$E=[e'(n)e'(n+1) \ldots e'(n+N)]^T$$

$$A*H=b \text{ form} \qquad (2)$$

Then, generating the pre-distorted signal at adaptive step n is obtained by the following equation (3):

$$y(n)=x(n)-e(n) \qquad (3)$$

wherein $e(n)=X*H \qquad (4)$

As shown in the equations (1) to (4), when the system is near its optimum convergence, z(n) is as close as possible to x(n). Then, the error e(n) is considerably small. In turn, errors are significant compared to when e(n) was large at the beginning of the adaptation process.

Hence, the continued operation of the same steps at convergence will cause floating point errors to accumulate. These errors will then be absorbed by the matrix solution to the vector H, where $H=[h(n)h(n-1) \ldots h(n-T)]^T$. Typical Matrix solutions used in this case are: LU decomposition, Cholesky decomposition etc. However, this process causes divergence of the DLA algorithm.

Generally, as indicated above, the basic structure of the DLA algorithm is known. However, according to certain embodiments of the present invention a stabilization of the DLA algorithm is provided, so as to stabilize the adaptive DLA algorithm.

According to certain embodiments of the present invention, a measure to cope with DLA instability is the use of conjugate gradient algorithm in a non-standard way.

Generally, the conjugate gradient algorithm is a numerical solution for particular systems of linear equations, namely those whose matrix is symmetric and positive-definite. The conjugate gradient algorithm is mainly implemented as an iterative algorithm.

However, the standard use of the conjugate gradient algorithm is neither suitable nor cost effective in terms of computational power. Most radio devices have limited processing power. Hence, an increase of cost due to the conjugate gradient requirements is not a viable option.

Non-traditional use of the conjugate gradient algorithm includes the use of significant of reduction in iterative steps used in computation of A*H=b. The traditional use of the conjugate gradient algorithm requires nearly 100 s (closer to 1000) of iterations to obtain a satisfactory solution to vector coefficients of H in A*H=b.

The standard conjugate gradient algorithm is briefly depicted below. In the standard use of the conjugate gradient method in the adaptive DLA, at the initial step, $r_k$ (the residual) and the direction $d_k$ are assigned equal to the cross correlation matrix, as shown in equation (5). (k=0 at the initial step).

$$d_k=r_k=b \qquad (5)$$

Then, a loop according to equations (6) to (10) below is performed, until $r_k$ is less than the specified error bound a which is defined to be very small.

Start of Loop $$\alpha_k = \frac{r_k^T r_k}{d_k^T A d_k} \qquad (6)$$

wherein $\alpha_k$ is a constant, $$x_k=x_{k-1}+\alpha_k d_k \qquad (7)$$

wherein $x_k$ is the current approximation to the vector H in the (A*H=b), $$r_k=r_{k-1}-\alpha_k A d_k \qquad (8)$$

wherein $r_k$ is the new residual, $$\beta_k = \frac{r_k^T r_k}{r_{k-1}^T r_{k-1}} \quad (9)$$

wherein $\beta_k$ is a constant, $$d_k = r_k + \beta_k d_{k-1} \quad (10)$$

wherein $d_k$ is the new direction.

End of Loop

At every DLA adaptation, all of the conjugate gradient steps have to be repeated. This includes the initialization of the residual as well as the direction. In addition the loop has to be repeated about 1000 times (depends on the size of A in A*H-b, A being the autocorrelation matrix) to bring the residual below ε. Generally, the error bound ε is set to be very small. Preferably, the error bound is set almost equal to zero for a most satisfactory solution.

It becomes apparent that the standard conjugate gradient steps cannot be adopted in this form for a commercial product. The idea that makes the conjugate algorithm feasible for a commercial product is described below.

Figure 2:
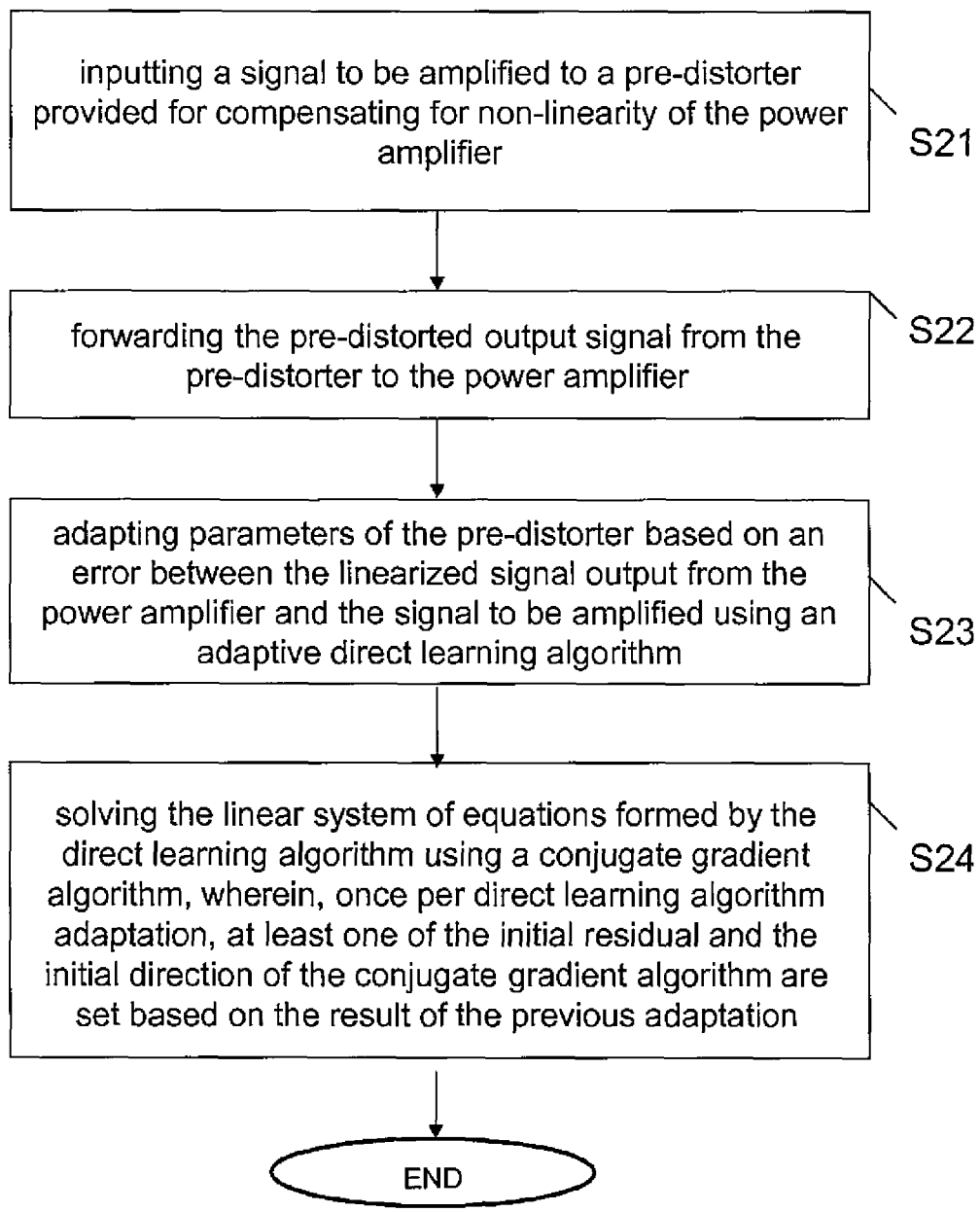
FIG. 2 shows a principle configuration of an example for a method according to certain embodiments of the present invention.

FIG. 2 shows a principle flowchart of an example for a method according to certain embodiments of the present invention.

In Step S21, a signal to be amplified is input to a pre-distorter provided for compensating for non-linearity of the power amplifier.

In Step S22, the pre-distorted output signal from the pre-distorter is forwarded to the power amplifier.

In Step S23, Parameters of the pre-distorter are adapted based on an error between the linearized signal output from the power amplifier and the signal to be amplified using an adaptive direct learning algorithm.

In step S24, the linear system of equations formed by the direct learning algorithm are solved using a conjugate gradient algorithm, wherein, once per direct learning algorithm adaptation, at least one of the initial residual and the initial direction of the conjugate gradient algorithm are set based on the result of the previous adaptation.

Figure 3:
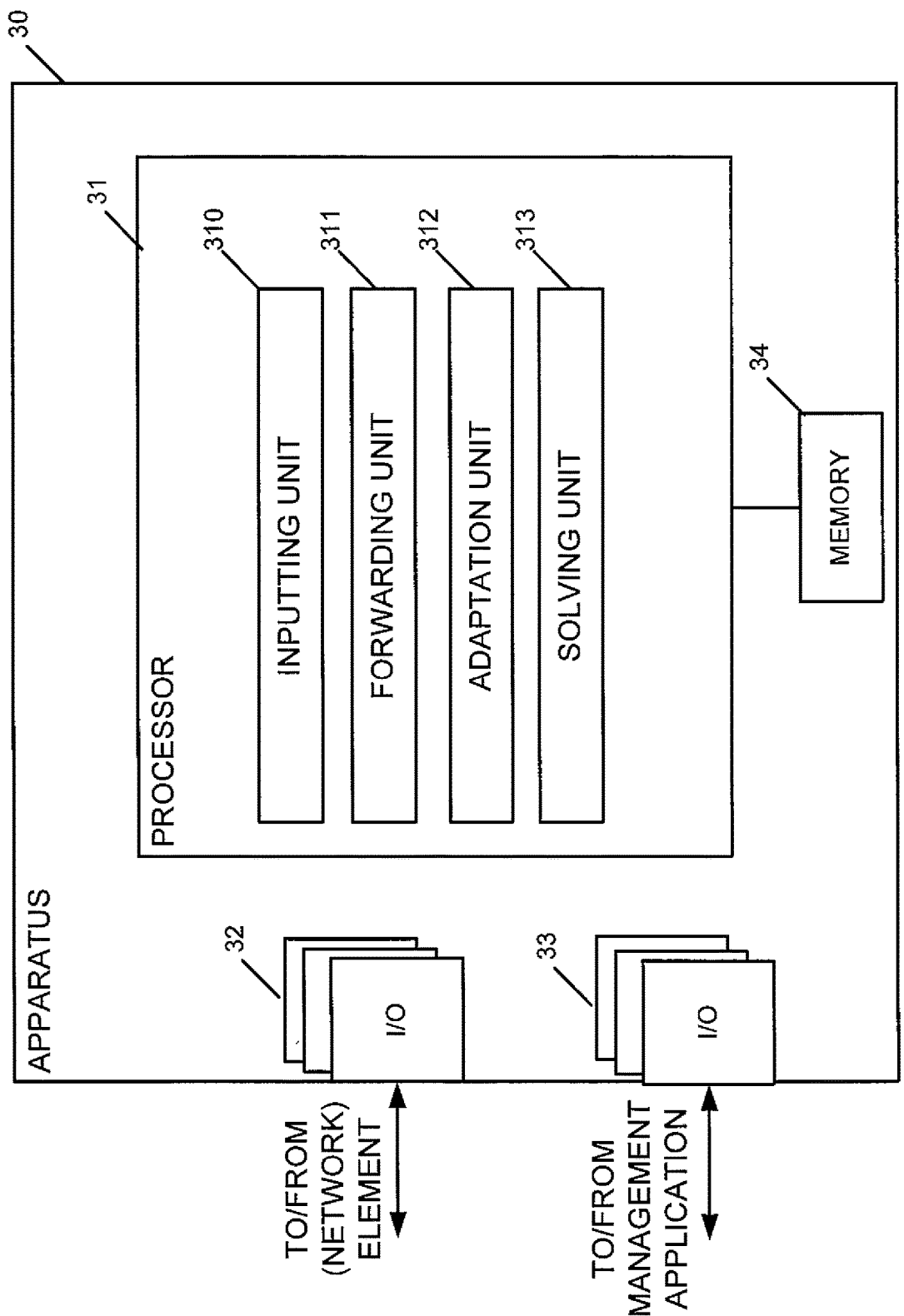
FIG. 3 shows a principle flowchart of an example for an apparatus according to certain embodiments of the present invention.

FIG. 3 shows a principle configuration of an example for an apparatus according to certain embodiments of the present invention, which is configured to implement stabilization of the direct learning algorithm for wideband signals described In connection with some of the example versions of the disclosure. It is to be noted that the apparatus may comprise elements or functions, such as a chipset, a chip, a module etc., which can also be part of a (network) element or attached as a separate element to a (network) element, or the like. It should be understood that each block and any combination thereof may be implemented by various means or their combinations, such as hardware, software, firmware, one or more processors and/or circuitry.

The apparatus 30 shown in FIG. 3 may comprise a processing function, control unit or processor 31, such as a CPU or the like, which is suitable for executing instructions given by programs or the like related to the network element control procedure.

The processor 31 is configured to execute processing related to the above described stabilization of the direct learning algorithm for wideband signals. In particular, the processor 31 comprises a sub-portion 310 as an inputting unit configured to input a signal to be amplified to a pre-distorter provided for compensating for non-linearity of the power amplifier. The portion 310 may be configured to perform processing according to S21 of FIG. 2. Furthermore, the processor 31 comprises a sub-portion 311 usable as a forwarding unit configured to forward the pre-distorted output signal from the pre-distorter to the power amplifier. The portion 311 may be configured to perform processing according to S22 of FIG. 2. Furthermore, the processor 31 comprises a sub-portion 312 usable as a adaptation unit configured to adapt parameters of the pre-distorter based on an error between the linearized signal output from the power amplifier and the signal to be amplified using an adaptive direct learning algorithm. The portion 312 may be configured to perform processing according to S23 of FIG. 2. Furthermore, the processor 31 comprises a sub-portion 313 usable as a solving unit configured to solve the linear system of equations formed by the direct learning algorithm using a conjugate gradient algorithm, wherein, once per direct learning algorithm adaptation, at least one of the initial residual and the initial direction of the conjugate gradient algorithm are set based on the result of the previous adaptation. The portion 313 may be configured to perform processing according to S24 of FIG. 2.

Reference signs 32 and 33 denote input/output (I/O) units (interfaces) connected to the processor 31. The I/O units 32 may be used for communicating with a (network) element. The I/O units 33 may be used for communicating with a management application. Reference sign 34 denotes a memory usable, for example, for storing data and programs to be executed by the processor 31 and/or as a working storage of the processor 31.

These measures enable to run the adaptive DLA algorithm perpetually without an accumulated numerical error, with a significant reduction in conjugate gradient steps, and achieving guaranteed convergence with proper initialization.

According to certain embodiments of the present invention, both the DLA algorithm as well as the conjugate gradient steps are modified.

That is, a modified of DLA algorithm according to certain embodiments is shown below in equations (11) and (12):

At adaptive step n:

$X = [x'(n)x'(n-1)x'(n-T) \ldots x'(n)|x(n)|^{L1}x'(n-1)|x'(n-1)|^{L1}x'(n-T)|x'(n-T)|x'(n-T)|^{L1}$ $x'(N+n)x'(N+n-1)x'(N+n-T) \ldots x'(N+n)|x'(N+n)|^{L1}x'(N+n-1)|x'(N+n-1)|^{L1}x'(N+n-T)|x'(N+n-T)|^{L1}]$ $H = [h'(n)h'(n-1) \ldots h'(n-T)]^T$ $(X^H X)^* H = X^H E$ $E = [e'(n)e'(n+1) \ldots e'(n+N)]^T$ $$A*H = b \text{ form} \quad (12)$$

x is a matrix that consists of linear and non-linear elements. In the A*H=b form, A is the autocorrelation matrix ($X^H$ X) and the b is the cross correlated vector $X^H$E. L1 in the above equation depicts the order of non-linearity. It is to be noted that in this terminology e(n) is a vector at $n^{th}$ time, where as e'(n) is not. Similarly h'(n) is not a vector but a single sample. H is a vector.

The generation of the pre-distorted signal at the adaptive step n is performed according to the following equations (13) and (14):

$$y(n) = x(n) - \mu * e(n) \text{[Modified DLA step]} \quad (13)$$

$$\text{where, } e(n) = X*H \quad (14)$$

The main modification to the adaptive DLA algorithm according to certain embodiments of the invention is the introduction of the error scaling factor μ. The Error scaling factor of the normal DLA algorithm is equal to 1.0. However, the modified adaptive DLA algorithm according to certain embodiments of the invention provides error scaling factors that are smaller than 1.0 (i.e. μ=0.1, 0.2, 0.25, 0.5 . . . ).

A smaller error scaling factor achieves less numerical error accumulation and a much more close approximation of the actual global minima. This, however, does not fully eliminate instability. Instability may still occur at much later adaptations.

While the amount of numerical error accumulation is less with a smaller p, modifications to conjugate gradient steps provides complete stability of the adaptive DLA algorithm. Hence, according to certain embodiments of the present invention, Improved conjugate gradient steps for Adaptive DLA are provided as follows.

As discussed above, the conjugate gradient technique will be used to solve the linear system of equations A*H=b formed by the adaptive DLA DPD algorithm.

At the Initial step $r_0$ (the residual) and the direction $d_0$ are assigned to be equal to the cross correlation matrix. This step also assumes that $x_0=[0, 0, 0, \ldots 0]$ (the solution is assumed to be a vector of zeros). Better initial conditions may exist and are discussed later.

In the following equations (15) to (17) the DLA adaptation number is depicted with letter n.

At n=0 [The very first DLA adaptation]

$$d_n = r_n = b \text{ [with initial conditions stated above]} \quad (15)$$

At n>0 [At $n^{th}$ DLA adaptation] (Note that DLA adaptation never stops)

$$r_{init} = b - A * x_{n-1} \quad (16)$$

[wherein $x_{n-1}$ is the solution at the $(n-1)^{th}$ DLA adaptation]

$$d_{init} = r_{init} \quad (17)$$

The above two steps are performed only once per ever every DLA adaptation. It sets the initial residual and initial direction at the beginning of the $n^{th}$ adaptation. One of the important functions of this initial residual equation is to eliminate the accumulated numerical error. On the other hand, setting the initial direction helps restore the orthogonality of the residual. Residual orthogonality can be degraded due to numerical error accumulation. As stated, the frequency of this step is independent of the size of the matrix A and needs to be performed only at the beginning only of the DPD DLA adaptation.

In addition, $r_{init}$ is computed with the partially converged previous solution $x_{n-1}$. Hence, the use of previous result eliminates the necessity of large iterative steps of required of the conjugate gradient technique (see below).

Loop1 of the conjugate gradient Step (using $r_{init}$ and $d_{init}$)

$$\alpha_1 = \frac{r_{init}^T r_{init}}{d_{init}^T A d_{init}} \quad (18)$$

wherein $\alpha_1$ is a constant $$x_1 = x_{n-1} + \alpha_1 d_1 \quad (19)$$

wherein $x_{n-1}$ is the previously converged solution in adaptation n $$r_1 = r_{init} - \alpha_1 A d_{init} \quad (20)$$

$$\beta_1 = \frac{r_1^T r_1}{r_{init}^T r_{init}} \quad (21)$$

wherein $\beta_1$ is a constant $$d_1 = r_1 + \beta_1 d_{init} \quad (22)$$

End of loop 1

Repeating this loop from k=2 to Imax (Typical Imax values are 4, 12, . . . 32):

$$\alpha_k = \frac{r_k^T r_k}{d_k^T A d_k} \quad (23)$$

wherein $\alpha_k$ is a constant $$x_k = x_{k-1} + \alpha_k d_k \quad (24)$$

wherein $x_k$ is the current approximation to the vector H in (A*H=b)

$$r_k = r_{k-1} - \alpha_k A d_k \quad (25)$$

wherein $r_k$ is the new residual $$\beta_k = \frac{r_k^T r_k}{r_{k-1}^T r_{k-1}} \quad (26)$$

wherein $\beta_k$ is a constant $$d_k = r_k + \beta_k d_{k-1} \quad (27)$$

wherein $d_k$ is the new direction

End of loop when k=Imax

As shown above, the improved conjugate gradient algorithm will only iterate up to Imax. Generally, at the first few adaptations, Imax can be as high as 32. Later, it can be reduced to something as small as 4 if adequate convergence is needed. This achieves a significant reduction of conjugate gradient steps. It does not, however, sacrifice any accuracy of the solution $x_k$. This is because the improved conjugate gradient algorithm does not waste the partially converged results from previous adaptations. Instead, it uses previous results to as a benefit.

The advantages of the embodiments of the present invention provide reduced use of the ASIC resources and improved performance compared to the existing fixed point based iterative inversion method. Due to the iterative nature of the improved DLA method, it is also ideally suited for small cells.

In the foregoing exemplary description of the apparatus, only the units that are relevant for understanding the principles of the invention have been described using functional blocks. The apparatuses may comprise further units that are necessary for its respective function. However, a description of these units is omitted in this specification. The arrangement of the functional blocks of the apparatuses is not construed to limit the invention, and the functions may be performed by one block or further split into sub-blocks.

According to exemplarily embodiments of the present invention, a system may comprise any conceivable combination of the thus depicted devices/apparatuses and other network elements, which are arranged to cooperate as described above.

Embodiments of the present invention may be implemented as circuitry, in software, hardware, application logic or a combination of software, hardware and application logic.

As used in this application, the term "circuitry" refers to all of the following: (a) hardware-only circuit implementations (such as implementations in only analog and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) to circuits, such as a microprocessor(s) or a portion of a microprocessor(s), that require software or firmware for operation, even if the software or firmware is not physically present. This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a similar integrated circuit in server, a cellular network device, or other network device.

The present invention relates in particular but without limitation to mobile communications, for example to environments under GSM, HSDPA, UMTS, LTE, WCDMA, WIMAX and WLAN and can advantageously be implemented also in controllers, base stations, user equipments or smart phones, or personal computers connectable to such networks. That is, it can be implemented as/in chipsets to connected devices, and/or modems thereof.

If desired, the different functions discussed herein may be performed in a different order and/or concurrently with each other. Furthermore, if desired, one or more of the above-described functions may be optional or may be combined.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications which may be made without departing from the scope of the present invention as defined in the appended claims.

The following meanings for the abbreviations used in this specification apply:

| | |
|---|---|
| 3GPP | 3$^{rd}$ Generation Partnership Project |
| DLA | direct learning algorithm |
| DPD | Digital Pre-Distortion |
| ILA | Indirect Learning Algorithm |
| IM | Inter Modulation |
| PA | Power Amplifier |
| RF | Radio Frequency |

What is claimed is:

1. A method, comprising:
   inputting a signal to be amplified to a pre-distorter provided for compensating for non-linearity of a power amplifier;
   forwarding the pre-distorted output signal from the pre-distorter to the power amplifier;
   adapting parameters of the pre-distorter based on an error between a linearized signal output from the power amplifier and the signal to be amplified using an adaptive direct learning algorithm; and
   solving a linear system of equations formed by the adaptive direct learning algorithm using a conjugate gradient algorithm, the solving comprising, once per adaptation of the adaptive direct learning algorithm, setting at least one of an initial residual and an initial direction of the conjugate gradient algorithm based on a result of a previous adaptation, wherein the initial residual and/or the initial direction of the conjugate gradient algorithm is/are set so as to fulfill the following equations:

$rinit = b - A*xn-1$, and $dinit = rinit$, wherein rinit is an initial residual vector for the initial residual, dinit is an initial direction vector for the initial direction, b is a cross-correlated vector of the error, A is an autocorrelation matrix, and xn−1 is a solution vector at the (n−1)th adaptation of the direct learning algorithm.

2. The method according to claim 1, wherein the initial residual and/or the initial direction of the conjugate gradient algorithm is/are set at a beginning of the adaptation.

3. The method according to claim 1, wherein loops of the conjugant gradient algorithm are iterated until reaching a preset number of loops.

4. The method according to claim 1, wherein the initial residual and/or the initial direction of the conjugate gradient algorithm is/are computed based on a partially converged solution of the previous adaptation.

5. A method, comprising:
   inputting a signal to be amplified to a pre-distorter provided for compensating for non-linearity of a power amplifier;
   forwarding the pre-distorted output signal from the pre-distorter to the power amplifier;
   adapting parameters of the pre-distorter based on an error between a linearized signal output from the power amplifier and the signal to be amplified using an adaptive direct learning algorithm; and
   solving a linear system of equations formed by the adaptive direct learning algorithm using a conjugate gradient algorithm, the solving comprising, once per adaptation of the adaptive direct learning algorithm, setting at least one of an initial residual and an initial direction of the conjugate gradient algorithm based on a result of a previous adaptation,
   wherein an error scaling factor is introduced in the adaptive direct learning algorithm, so as to fulfill the following equation:

$y(n) = x(n) - \mu*e(n)$, wherein y is the pre-distorted signal vector corresponding to the pre-distorted output signal, x is a vector of the signal to be amplified, e is an error vector corresponding to the error, μ is the error scaling factor, and n indicates an adaptation number for a current adaptation.

6. The method according to claim 5, wherein the error scaling factor is set to a value smaller than 1.0.

7. An apparatus, comprising:
   a pre-distorter;
   a power amplifier;
   at least one processor, and
   at least one memory for storing instructions to be executed by the processor, wherein the at least one memory and the instructions are configured to, with the at least one processor, cause the apparatus at least to perform:

inputting a signal to be amplified to a pre-distorter provided for compensating for non-linearity of the power amplifier;

forwarding the pre-distorted output signal from the pre-distorter to the power amplifier;

adapting parameters of the pre-distorter based on an error between a linearized signal output from the power amplifier and the signal to be amplified using an adaptive direct learning algorithm; and solving a linear system of equations formed by the adaptive direct learning algorithm using a conjugate gradient algorithm, the solving comprising, once per adaptation of the direct learning algorithm, setting at least one of the initial residual and the initial direction of the conjugate gradient algorithm based on a result of a previous adaptation, and wherein the initial residual and/or the initial direction of the conjugate gradient algorithm is/are set so as to fulfill the following equations:

$$rinit = b - A * xn-1, \text{ and}$$

$$dinit = rinit,$$

wherein rinit is an initial residual vector for the initial residual, dinit is an initial direction vector for the initial direction, b is a cross-correlated vector of the error, A is and autocorrelation matrix, and xn−1 is a solution vector at an (n−1)th adaptation of the direct learning algorithm.

8. The apparatus according to claim 7, wherein the initial residual and/or the initial direction of the conjugate gradient algorithm is/are set at a beginning of an adaptation.

9. The apparatus according to claim 7, wherein loops of the conjugant gradient algorithm are iterated until reaching a preset number of loops.

10. The apparatus according to claim 7, wherein the initial residual and/or the initial direction of the conjugate gradient algorithm is/are computed based on a partially converged solution of the previous adaptation.

11. An apparatus, comprising:
a pre-distorter;
a power amplifier;
at least one processor, and
at least one memory for storing instructions to be executed by the processor, wherein the at least one memory and the instructions are configured to, with the at least one processor, cause the apparatus at least to perform:

inputting a signal to be amplified to a pre-distorter provided for compensating for non-linearity of the power amplifier;

forwarding the pre-distorted output signal from the pre-distorter to the power amplifier;

adapting parameters of the pre-distorter based on an error between a linearized signal output from the power amplifier and the signal to be amplified using an adaptive direct learning algorithm; and solving a linear system of equations formed by the adaptive direct learning algorithm using a conjugate gradient algorithm, the solving comprising, once per adaptation of the direct learning algorithm, setting at least one of the initial residual and the initial direction of the conjugate gradient algorithm based on a result of a previous adaptation, wherein an error scaling factor is introduced in the adaptive direct learning algorithm, so as to fulfill the following equation:

$$y(n) = x(n) - \mu * e(n),$$

wherein y is a pre-distorted signal vector corresponding to the pre-distorted output signal, x is a vector of the signal to be amplified, e is an error vector corresponding to the error, μ is the error scaling factor, and n indicates an adaptation number for a current adaptation.

12. The apparatus according to claim 11, wherein the error scaling factor is set to a value smaller than 1.0.

13. A computer program product for a computer, comprising a non-transitory computer-readable medium having software code portions thereon for causing the computer to perform the steps of claim 1 when said product is run on the computer.

14. The method according to claim 1, wherein setting comprises setting both the initial residual and the initial direction of the conjugate gradient algorithm based on the result of the previous adaptation, and, for a very first adaptation, setting the initial residual and the initial direction of the conjugate gradient algorithm based on a cross-correlated vector of the error, the cross-correlated vector used in the linear system of equations, and wherein, for adaptations after the very first adaptation, setting both the initial residual and the initial direction of the conjugate gradient algorithm based on the result of the previous adaptation.

* * * * *